United States Patent [19]

Kempf

[11] Patent Number: 5,259,942
[45] Date of Patent: Nov. 9, 1993

[54] DEVICE FOR TRANSFERRING A WORKPIECE INTO AND OUT FROM A VACUUM CHAMBER

[75] Inventor: Stefan Kempf, Alzenau, Fed. Rep. of Germany

[73] Assignee: Leybold Aktiengesellschaft, Hanau, Fed. Rep. of Germany

[21] Appl. No.: 895,562

[22] Filed: Jun. 5, 1992

Related U.S. Application Data

[63] Continuation of Ser. No. 402,637, Sep. 5, 1989, abandoned.

[30] Foreign Application Priority Data

Mar. 30, 1989 [DE] Fed. Rep. of Germany ....... 3910244

[51] Int. Cl.$^5$ ............................................. C23C 14/34
[52] U.S. Cl. .............................. 204/298.25; 118/719; 118/730; 204/298.28; 414/217; 414/223
[58] Field of Search .................. 204/298.15, 298.23, 204/298.25, 298.26, 298.27, 298.28, 298.35; 118/719, 723, 728, 729, 730; 414/217, 222

[56] References Cited

U.S. PATENT DOCUMENTS

| 3,915,117 | 10/1975 | Schertler | 118/719 |
| 4,534,314 | 8/1985 | Ackley | 204/298.25 X |
| 4,548,699 | 10/1985 | Hutchinson et al. | 204/298.25 |
| 4,588,343 | 5/1986 | Garrett | 204/298.25 |
| 4,670,126 | 6/1987 | Messer et al. | 204/298.25 |
| 4,701,251 | 10/1987 | Beardow | 204/298 |
| 4,756,815 | 7/1988 | Turner et al. | 204/298.25 |
| 4,820,106 | 4/1989 | Walde et al. | 414/217 |
| 4,869,801 | 9/1989 | Helme et al. | 204/298.27 X |
| 4,886,592 | 12/1989 | Anderle et al. | 204/298.25 |

FOREIGN PATENT DOCUMENTS

| 0235731 | 2/1987 | European Pat. Off. . |
| 0218563A1 | 4/1987 | European Pat. Off. . |
| 3425453C2 | 10/1986 | Fed. Rep. of Germany . |
| 3716498 | 12/1988 | Fed. Rep. of Germany . |
| 3803411 | 8/1989 | Fed. Rep. of Germany . |
| 59-156761 | 2/1986 | Japan . |
| 2143546A | 2/1985 | United Kingdom . |

*Primary Examiner*—Nguyen Nam
*Attorney, Agent, or Firm*—Felfe & Lynch

[57] ABSTRACT

A device for transferring a workpiece into and out from a vacuum chamber including a first device for receiving and holding the workpiece in a disk-shaped conveyor within the chamber and a second device for lifting and supporting the first device during the transfer process.

12 Claims, 1 Drawing Sheet

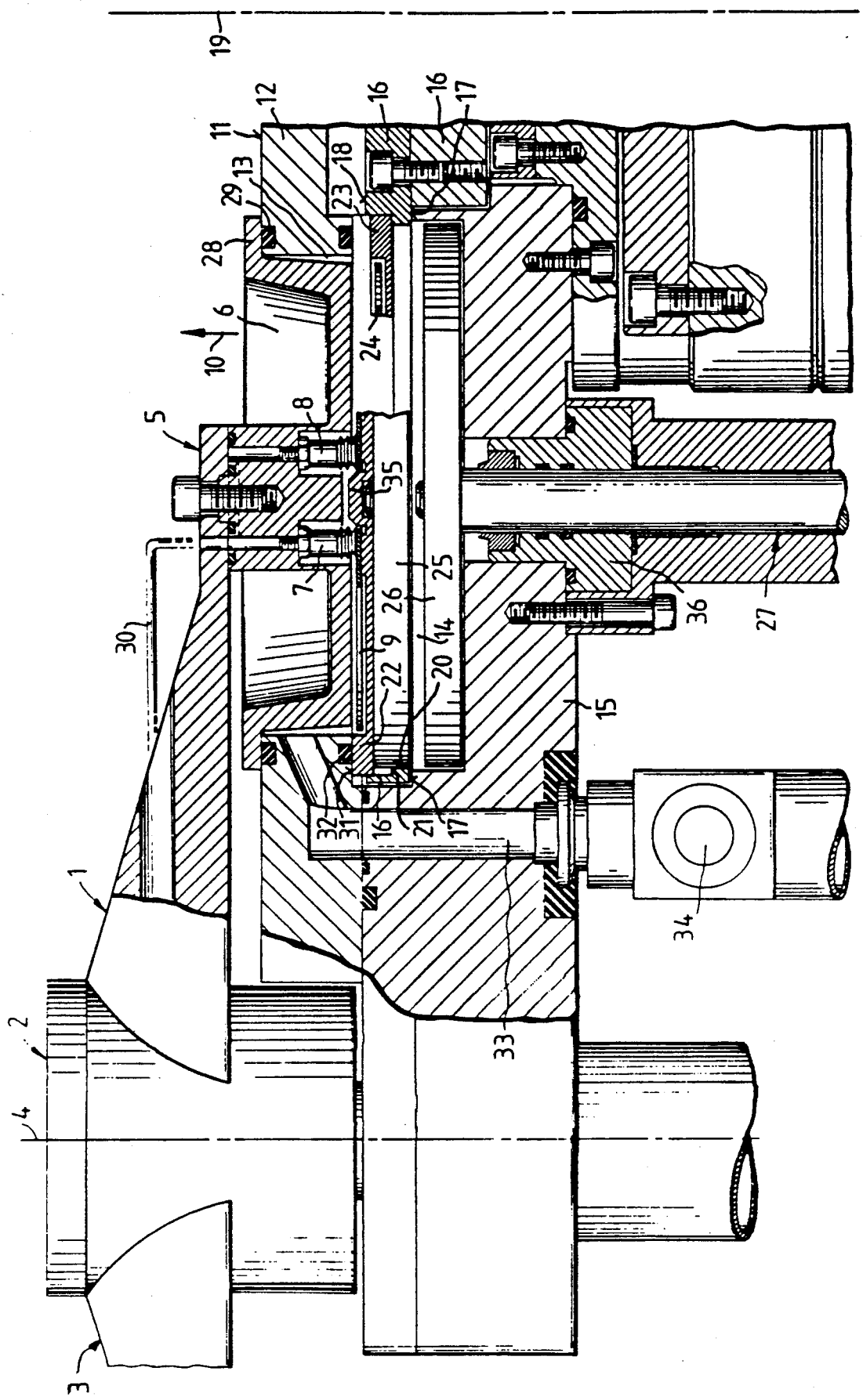

DEVICE FOR TRANSFERRING A WORKPIECE INTO AND OUT FROM A VACUUM CHAMBER

This application is a continuation of U.S. patent application Ser. No. 07/402,637, filed Sept. 5, 1989, now abandoned.

BACKGROUND OF THE INVENTION

The present invention generally relates to a device for transferring a workpiece into and out from a vacuum chamber which may contain a conveyor device for moving the workpiece within the chamber. More specifically, the invention relates to a device for transferring a workpiece into and out from a process/vacuum chamber of a cathode sputtering system.

The coating of substrates (or workpieces), for example, of compact disks, (CD's) is known in vacuum processing technology, particularly in thin-film technology. Compact disks are a modern storage medium for digital information. Imprinted plastic disks are sputter coated with a layer, for example, a layer of aluminum having a thickness of less than 1/10,000 mm. The sputter coating systems utilized for this purpose generally include a turntable for conveying the substrates from position-to-position within a processing/vacuum chamber of the system.

Further, a robot device may be used to load and unload the substrates to and from the system via an airlock in a clean room. The turntable is equipped with a substrate carrier and conveys the substrate from the airlock through the vacuum chamber. Sputtering ensues by means of a high power sputtering cathode constructed as a magnetron.

In German published application DE 3716498, there is disclosed a device for transferring an essentially flat workpiece into an evacuated vacuum coating chamber and for delivering and withdrawing the workpiece to and from the deposition area of a coating source for the purpose of depositing a coating on a surface of the workpiece. This reference describes a device in which a coating mechanism is arranged in an area of the coating chamber. The transfer mechanism includes one or more cover shaped workpiece carriers which are used to move the workpieces into a position adjacent a transfer opening of the coating chamber. As a result, the opening can be closed by, first, the workpiece carrier and, second, a lifting plate that is held and guided on a rotary turntable that is rotatably seated within the coating chamber. The workpiece carrier can be pressed against the opening and the top or cover of the coating chamber by lifting cylinders supported against the charging mechanism and the lifting plate can be pressed thereagainst by a lifting mechanism secured to the bottom plate.

U.S. Pat. No. 3,915,117 discloses a vacuum coating apparatus for coating various products comprising a housing which includes a fixed part and a rotatable cover part which, together, define a closed, gas sealable, housing chamber which may be evacuated. A plurality of product supports are carried on the rotatable part of the housing at spaced locations and they are movable to present them at various operating stations. One of the operating stations preferably includes a gas sealable coating chamber which is communicable with the gas sealed housing chamber and it is provided with separate means for evacuating the coating chamber. Movable sealing means are located at at least one of the stations for sealing the coating chamber and isolating it from the housing chamber. Similarly, a loading chamber is located at a separate station and is separately communicable with the housing chamber, or it may be isolated from the housing chamber and separately evacuated.

The moveable sealing means comprises a plate member engageable on a bottom side of a ring member that itself serves as a workpiece support member. The plate member is axially moveable and is used to move the ring member against an axial end of a transfer chamber opening.

The devices of the prior art exhibit several disadvantages in use.

Overall, the rotary turntable must be made so as to be extremely sturdy. A sturdy substrate carrier is also required in order to avoid sagging.

To make these items sturdy, they are made heavy and, accordingly, large masses must be conveyed during the processing cycles. Due to the corresponding high mass moments of inertia, the processing cycles sequence correspondingly slowly. Limits are therefore placed on how economical processing with such systems can be.

Yet further, the workpiece/substrate holder must be made very sturdy because the workpiece/substrate holder is subjected to high flexural stresses when the lifting mechanisms for the holder is raised and when the holder is supported or pressed against parts of the vacuum chamber.

Additionally, the cost of the individual parts is extremely high. This cost is multiplied by the plurality of substrate holders in the rotary plate.

SUMMARY OF THE INVENTION

The present invention provides an improved device for transferring substrates into and out of the vacuum chamber. Moreover, the present invention provides an improved device for transferring substrates into and out from a cathode sputtering system process/vacuum chamber.

To these ends, the present invention provides in an embodiment, a disk-shaped turntable provided with at least one opening through which a plate-shaped lifting and supporting element can extend to lift and support a substrate holder retainable within the opening. Accordingly, it can thereby be provided that the lifting and supporting element presses the holder against appropriate parts of the vacuum chamber.

In a preferred embodiment, in order to achieve a support effective over the entire cross-section of the substrate holder, the supporting element is fashioned as a supporting plate that can be axially moved by a lifting mechanism.

In order to diminish the mass that is rotated, the embodiment preferably includes that the substrate holder is fashioned as a thin, particularly membrane-like disk.

For centering the workpiece, the holder preferably is equipped with a centering means, particularly in the form of a projection that engages the substrate.

The turntable preferably includes a frame-shaped receptacle element for receiving the substrate holder. The substrate holder then is secured to the turntable within at least one receptacle opening that includes shoulder-shaped detents.

The turntable preferably comprises a rotatable annular plate that rotates within the process chamber. The plate includes several circular receptacle openings that can be brought into co-axial position relative to the lifting and supporting element.

Yet further, in the preferred embodiment, a retaining device is fashioned as the substrate holder, particularly for disk-shaped substrates. The rotary turntable conveys the substrate holder together with the substrate into the area of one or more coating sources, particularly sputtering cathodes, within the process chamber of the coating system.

An advantage of the invention is the provision of a cathode sputtering system including a light weight rotary turntable and substrate holder.

Another advantage of the system is that processing cycles can sequence more quickly due to the greatly reduced moments of inertia of the turntable and substrate holders.

Yet further, an advantage of the invention is that a cathode sputtering system is provided that can be economically manufactured due to the reduced dimensions of the processing chamber, including the chamber thickness and chamber volume.

These and other advantages of the invention will become more apparent with reference to the following detailed description and the accompanying drawing.

BRIEF DESCRIPTION OF THE DRAWING

In the only figure, there is illustrated in cross-sectional view, a portion of a cathode sputtering system including an apparatus embodying principles of the invention for transferring a substrate to and from the processing chamber of the system.

DETAILED DESCRIPTION OF THE PRESENTLY PREFERRED EMBODIMENTS

In the figure, there is illustrated a cathode sputtering system employing an apparatus embodying principles of the invention. The apparatus is designed for transferring a substrate or workpiece to and from the process chamber of the sputtering system.

For a complete understanding of the invention, reference should also be made to the prior art as represented by U.S. Pat. No. 3,915,117 and German published application DE 3716498. To the extent permitted, the disclosures of these patent documents are incorporated herein.

In the figure, a crossbeam 1 is mounted liftable, lowerable, and rotatable on an appropriate lifting unit 2. The crossbeam 1 is part a conveyor means that is equipped with two arms forming a T-shape. The crossbeam 1 comprises the first arm of the conveyor means. A second crossbeam 3, only partially illustrated, comprises the second arm of the conveyor means.

The two arms are rotatable about an axis 4 so that the crossbeams 1 and 3 rotate together. By rotating or turning 180°, the crossbeam 1 is brought into the position originally occupied by the crossbeam 3. Accordingly, the crossbeam 3 is rotated into the position originally occupied by the crossbeam 1.

A cover 6 is located and supported on a right-hand end 5 (with reference to the figure) of the crossbeam 1. Three suction devices, only two of which (7 and 8) are illustrated, are accommodated within the cover 6. The illustrated suction devices 7 and 8 provide a vacuum source employed to retain a substrate 9 against the cover 6.

In the figure, the substrate 9 comprises a disk (for example, a compact disk), only a portion of which is illustrated. When the crossbeam 1 is lifted by the unit 2, it lifts the cover 6 and substrate 9 in the direction indicated by the arrow 10. After the cover 6 is lifted above an upper edge 11 of a cover 12 of a process/vacuum chamber 14 of the cathode sputtering system, the crossbeams 1 and 3 can be rotated by 180°, thus removing the substrate 9 from the process/vacuum chamber.

A transfer chamber 13 that is small in volume in comparison to the volume of the process/vacuum chamber 14, is separated from the chamber 12. A lower wall of the chamber 14 is referenced by the numeral 15.

In the figure, there is only illustrated that portion of the process/vacuum chamber 14 that interacts with the transfer chamber 13.

A rotatable turntable 16 is accommodated within the process/vacuum chamber 14. However, in the figure, only that portion of the turntable 16 that interacts with the transfer chamber 13 is illustrated.

As illustrated, the turntable 16 comprises a lower surface 17 and an upper edge 18. The turntable 16 includes a ring-shaped channel or recess 16A so that an upper surface 16B is formed having a circumferential wall 16C. The turntable 16 rotates about an axis 19 within the chamber 14.

The turntable plate 16 includes four receptacle openings 20, only one of which is illustrated. Each receptacle opening 20 comprises a cylindrical recess in the surface 16B of the turntable 16.

Because the figure is a cross-sectional view, the illustrated receptacle opening 20 is illustrated by means of a pair of lines. These lines depict the upper surface 16B and the lower surface 17 of the turntable.

A shoulder 21 on which a substrate holder 22 is located, is provided about the opening 20.

A supporting plate 25 (also referenced by the numeral 26 in an alternate position) is employed to support the substrate holder during lifting and lowering. The supporting plate 25/26 can be lifted and lowered between supporting and non-supporting positions, respectively. The supporting plate in its supporting position is referenced as 25. The supporting plate in its non-supporting position is referenced as 26. The supporting plate is raised and lowered by means of a shaft 27 operatively connected thereto.

An appropriate seal and guide combination 36 is provided about the shaft 27. The seal and guide combination seals about the shaft 27 to seal the chamber 14 to maintain same under vacuum pressure.

The various components of the system having been described, a description of the procedure by which a substrate is transferred into and from the chamber 14 follows.

For the inward transfer of a substrate, the substrate is picked up by the crossbeam located in the position of the crossbeam 3 in the figure. To this end, the substrate is picked up and retained against the cover 6 by means of the suction devices therein, including the suction devices 7 and 8. The crossbeams 1 and 3 and substrate are then lifted and rotated about the axis 4 by 180°. The crossbeams and substrate are then in the position illustrated in the figure.

For the purposes of this description, it is assumed that the substrate involved is the substrate 9. Further, the crossbeam involved is the crossbeam 1.

After the crossbeam 1 and substrate 9 are in the orientation illustrated in the figure, the crossbeam 1 is lowered into the position illustrated in the figure. In these lowered position, edge 28 of the cover 6 lies on seal 29 in sealing relationship. The seal 29 preferably comprises an 0-ring.

Once the cover 6 with substrate 9 is in the lowered position, the suction devices are turned off and the suction effect is terminated. Thus, the substrate 9 is released from the cover 6 and is received into the substrate holder 22.

The supporting plate, which previously was appropriately lifted as illustrated at 25, at this time supports the substrate holder 22. To this end, the supporting plate 25 presses the holder 22 against a seal 32 of an inside surface 31 of the chamber 14. The seal 32 comprises an appropriate 0-ring. At this time, the inward transfer chamber 13 is isolated from the atmosphere and the process/vacuum chamber in air tight fashion.

The transfer chamber 13 is then evacuated by means of a line 33 and an appropriate airlock valve 34.

After the transfer chamber 13 is evacuated, the support plate is moved to its lower position at 26. The transfer chamber 13 is then in communication with the vacuum chamber 14.

As the supporting plate is lowered, the substrate holder 22 is received onto the shoulder 21 of the receptacle opening 20 of the turntable 16. The substrate holder is illustrated in this position as 23 at the right hand portion of the figure. In this position, the substrate 9 is referenced by the numeral 24.

Once the supporting plate 26 has been lowered, the turntable 16 is permitted to rotate inside the chamber with the substrate holder 23, as well as the substrate 24. It can be appreciated that by means of this rotation, the substrate 24 can be rotated from position-to-position to various stations within the process/vacuum chamber. Such stations can include, for example, a cathode sputtering station.

As a further example, four stations can be arranged in the process/vacuum chamber. Assuming these stations are positioned at 90° intervals along the rotational path of the substrate holder 23, the turntable 16 would accordingly be driven in 90° increments. After four increments, a cycle would be complete and the substrate 24 would be positioned for transferring out from the process/vacuum chamber 14.

It can be appreciated that the outward transfer process of the substrate is virtually the reverse of the inward transfer process.

At the commencement of the outward transfer process, the supporting plate 25/26 is raised from the lowered position at 26 to the lifted position at 25. In the lifted position, the supporting plate 25 presses the substrate holder 22/23 against the seal 32.

The transfer chamber 13 then is again pressure isolated from the process/vacuum chamber 14. As the outward transfer process ensures, the transfer chamber 13 is filled via the line 33 by appropriate operation of the airlock valve 34.

Once the transfer chamber 13 is placed under atmospheric pressure, the suction devices are activated by appropriate evacuation of the line 30. The suction devices suction and retain the substrate 9 against the cover 6.

Subsequently, the cover 6 is lifted by means of the crossbeams 1 and 3 and the lifting unit 2. The crossbeams 1 and 3 are then caused to rotate by 180°. Finally, the coated substrate is released by the suction devices.

It can be appreciated that a plurality of thin, membrane like substrate holders can be arranged in the turntable. Each substrate is centrally placed in a holder. This centering is ensured by means of the use of a projecting member 35 that engages a corresponding opening in the substrate.

The substrate holder preferably is made of aluminum.

It can also be appreciated that the supporting plate 25/26 prevents sagging of the thin substrate holder. The turntable can also be designed to be extremely thin. Thus, mass moments of inertia of the turntable and of the substrate holders are considerably reduced.

While a preferred embodiment has been shown, modifications and changes may become apparent to those skilled in the art which shall fall within the spirit and scope of the invention. It is intended that such modifications and changes be covered by the attached claims.

I claim as my invention:

1. Vacuum coating apparatus comprising
   a vacuum chamber having a circular aperture therethrough for transferring a workpiece into and out of said chamber,
   workpiece support means for receiving and supporting said workpiece in said vacuum chamber, said workpiece support means having a circular shape with a larger diameter than the aperture in said vacuum chamber.
   conveying means in said vacuum chamber for conveying said support means in said vacuum chamber, said conveying means having recess means therein for positioning said workpiece support means relative to said conveying means, and further having an aperture therethrough in said recess means, and
   lifting means comprising a circular plate which moves through said aperture in said conveying means to lift said workpiece support means free of said conveying means, said circular plate having a larger diameter than said aperture in said vacuum chamber, whereby
   said circular plate can press said workpiece support against said vacuum chamber about said aperture therethrough.

2. Apparatus as in claim 1 wherein said recess means is a circular recess and said aperture through said conveying means is centrally located in said recess, thereby forming an annular shoulder for supporting said workpiece support means in said recess.

3. Vacuum coating apparatus as in claim 1 wherein said workpiece support means comprises a thin, membrane-like disk.

4. Vacuum coating apparatus as in claim 3 wherein said disk seals said vacuum chamber during transfer of a workpiece.

5. Vacuum coating apparatus as in claim 1 wherein said workpiece support means includes means for centering said workpiece thereon.

6. Vacuum coating apparatus as in claim 1 wherein said conveying means is a turntable.

7. Vacuum coating apparatus comprising
   a vacuum chamber having an aperture therethrough for transferring a workpiece into and out of said chamber,
   workpiece support means for receiving and supporting said workpiece in said vacuum chamber,
   conveying means in said vacuum chamber for conveying said support means in said vacuum chamber, said conveying means having an aperture therethrough having dimensions larger than said aperture in said chamber but smaller than said support means, and lifting means comprising plate means registrable with and movable through said aperture in said conveying means.

8. Vacuum coating apparatus as in claim 7 wherein said aperture through said vacuum chamber has a circular shape.

9. Vacuum coating apparatus as in claim 7 wherein said aperture through said conveying means has a circular shape.

10. Vacuum coating apparatus as in claim 7 wherein said workpiece support means further comprises means for positioning said workpiece relative to said conveying means.

11. Vacuum coating apparatus as in claim 10 wherein said means for positioning said workpiece support means comprises a recess which forms support surface about said aperture through said conveying means.

12. Vacuum coating apparatus as in claim 7 wherein said conveying means is a turntable.

* * * * *